(12) United States Patent
Mishra et al.

(10) Patent No.: US 9,461,814 B1
(45) Date of Patent: **\*Oct. 4, 2016**

(54) HIGH-SPEED CLOCK SKEW CORRECTION FOR SERDES RECEIVERS

(71) Applicant: INPHI CORPORATION, Santa Clara, CA (US)

(72) Inventors: Parmanand Mishra, Thousand Oaks, CA (US); Simon Forey, Northamptonshire (GB)

(73) Assignee: INPHI CORPORATION, Santa Clara, CA (US)

( \* ) Notice: Subject to any disclaimer, the term of this patent is extended or adjusted under 35 U.S.C. 154(b) by 0 days.

This patent is subject to a terminal disclaimer.

(21) Appl. No.: 14/932,194

(22) Filed: Nov. 4, 2015

Related U.S. Application Data

(63) Continuation of application No. 14/715,494, filed on May 18, 2015, now Pat. No. 9,209,962.

(51) Int. Cl.
| | |
|---|---|
| *H03D 1/04* | (2006.01) |
| *H04L 7/00* | (2006.01) |
| *H03L 7/08* | (2006.01) |
| *H03K 5/135* | (2006.01) |
| *H04L 7/033* | (2006.01) |
| *H04B 1/10* | (2006.01) |
| *H03K 5/00* | (2006.01) |

(52) U.S. Cl.
CPC ............. *H04L 7/0079* (2013.01); *H03K 5/135* (2013.01); *H03L 7/0807* (2013.01); *H04B 1/10* (2013.01); *H04L 7/0331* (2013.01); *H03K 2005/00052* (2013.01)

(58) Field of Classification Search
CPC . H04L 7/0079; H04L 7/0331; H04L 7/0083; H04L 7/0087; H04L 7/0033; H04L 7/04; H04B 1/10; H04B 1/1027; H04B 1/1081; H04B 1/109
USPC ....... 375/224, 226, 228, 340, 346, 348, 350, 375/371, 373, 376; 370/503, 516–518
See application file for complete search history.

(56) References Cited

U.S. PATENT DOCUMENTS

| | | | |
|---|---|---|---|
| 8,664,994 B1 * | 3/2014 | Amrutur | H03H 17/0018 327/261 |
| 2006/0140321 A1 * | 6/2006 | Tell | H03L 7/0814 375/376 |
| 2006/0224339 A1 * | 10/2006 | Kim | H03L 7/0814 702/66 |
| 2009/0310667 A1 * | 12/2009 | Lee | H03L 7/0814 375/233 |
| 2010/0135378 A1 * | 6/2010 | Lin | H04L 7/0025 375/233 |
| 2010/0309791 A1 * | 12/2010 | Fuller | H04L 1/20 370/242 |

\* cited by examiner

*Primary Examiner* — Khanh C Tran
(74) *Attorney, Agent, or Firm* — Richard T. Ogawa; Ogawa P.C.

(57) ABSTRACT

The present invention is directed to data communication. More specifically, the present invention provides a mechanism for determining an adjustment delay that minimizes skew error due to poor alignment between edge samples and data samples. The adjustment delay is determined by sampling edge samples and data samples using different test delays at a calibration frequency that is different from the sampling frequency. The test delay associated with the least average position between the data samples and edge samples is selected as the adjustment delay. The adjustment delay is used as a parameter when sampling data at the sampling frequency. There are other embodiments as well.

20 Claims, 5 Drawing Sheets

HIGH-SPEED CLOCK SKEW CORRECTION FOR SERDES RECEIVERS

CROSS-REFERENCES TO RELATED APPLICATIONS

The present application is a continuation of U.S. patent application Ser. No. 14/715,494 filed on May 18, 2015, the entire content of which is incorporated herein by reference.
Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to data communication.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs. For high-data communication applications, serializer/deserializer (SERDES) is commonly used.

Over the past, there have been many types of communication systems and methods. Unfortunately, they have been inadequate for various applications. More specifically, the SERDES receivers are often inadequate. Therefore, improved systems and methods are desired.

BRIEF SUMMARY OF THE INVENTION

The present invention is directed to data communication. More specifically, the present invention provides a mechanism for determining an adjustment delay that minimizes skew error due to poor alignment between edge samples and data samples. The adjustment delay is determined by sampling edge samples and data samples using different test delays at a calibration frequency that is different from the sampling frequency. The test delay associated with the least average position between the data samples and edge samples is selected as the adjustment delay. The adjustment delay is used as a parameter when sampling data at the sampling frequency. There are other embodiments as well.

According to an embodiment, the present invention provides a receiver device. The device includes a data communication interface for receiving incoming data is associated with a sampling frequency. The device also includes a clock signal source configured to provide an edge clock and a data clock. The device includes a sampler that has an edge sampler and a data sampler. The edge sampler is configured to sample first data using the edge clock. The data sampler is configured to sample second data using the data clock. The device further includes a detection logic that is configured to determine relative delays between the first data and the second data. The device includes an accumulator for generating an average position based on the relative delays. The receiver is configured to initiate a delay calibration process. The receiver is also configured to select a calibration frequency that is different from the sampling frequency. The receiver is also configured to perform n sampling processes at the calibration frequency on the incoming data using m test delays to generate n first data and n second data for each of the m test delays. The receiver additionally determines relative delays for each of the n first data and corresponding second data for each of the m test delays by the detection logic. Also, the receiver calculates m average positions corresponding to m test delays using the accumulator. The receiver selects a target delay from the m test delays based on a lowest average position value. The receiver also samples the first data and the second data using with at least the target delay.

According to another embodiment, the present invention provides a receiver device that includes a data communication interface for receiving incoming data that is associated with a sampling frequency. The device also includes a clock signal source configured to provide an edge clock and a data clock. The device additionally includes a sampler comprising an edge sampler and a data sampler. The edge sampler is configured to sample first data using the edge clock. The data sampler is configured to sample second data using the data clock. The device further includes a detection logic configured to determine relative delays between the first data and the second data. The device additionally includes an accumulator for generating an average position based on the relative delays. The receiver is configured to initiate a delay calibration process. The receiver selects a calibration frequency, the calibration frequency being different from the sampling frequency. The receiver performs n samplings using a first test delay at the calibration frequency to generate n first data and n second data for the first test delay. The receiver determines relative delays for each of the n first data and corresponding second data for the first test delay by the detection logic. The receiver calculates a first average position for the first test delays using the accumulator. The receiver provides a second test delay based at least on the first test delay and the second first average position, the second test delay being associated with a second average position, the second average position being closer to zero than the first average position.

According to yet another embodiment, the present invention provides a method for skew correction. The method includes receiving incoming data from a data line that is characterized by a sampling frequency. The method also includes providing an edge clock and a data clock. The method further includes selecting a first calibration frequency that is different from the sampling frequency. The method also includes performing n samplings using a first test delay at the first calibration frequency to generate n first data using the data clock and n second data using the data clock for the first delay. The method further includes determining relatively delays for each of n first data and corresponding second data for the first test delay by a detection logic. The method additionally includes calculating a first average position for the first test delay. The method further includes providing a second test delay. The method also includes calculating a second average position for the second test delay. The method includes interpolating at least the first average position and a second average position to determine an adjustment delay parameter. The method includes sampling incoming data at the sampling frequency using the adjustment delay parameter.

It is to be appreciated that embodiments of the present invention provide many advantages over conventional techniques. By providing skew error corrections without using large devices to drive clocks, embodiments of the present invention effectively improves system performance without requiring a large amount of power consumption. Through effective reduction and/or elimination of skew errors, embodiments of the present invention improve many aspects (e.g., jitter tolerance, reliability, signal-to-noise ratio) of the high-speed receivers. Additionally, embodiments of the present invention can be compatible with existing systems. For example, certain implementations according to the present invention can be implemented by modifying software control logics. There are other benefits as well.

DETAILED DESCRIPTION OF THE INVENTION

The present invention is directed to data communication. More specifically, the present invention provides a mechanism for determining an adjustment delay that minimizes skew error due to poor alignment between edge samples and data samples. The adjustment delay is determined by sampling edge samples and data samples using different test delays at a calibration frequency that is different from the sampling frequency. The test delay associated with the least average position between the data samples and edge samples is selected as the adjustment delay. The adjustment delay is used as a parameter when sampling data at the sampling frequency. There are other embodiments as well.

Providing clock signals is a vital aspect in design and implementation of data communication systems. For example, a typical serializer/deserializer (SERDES) receiver uses an external clock as a reference to generate the recovered clock signal that is used to sample data. The external clock needs to be of high quality, and frequency is matched to within a few hundred parts per million of a known sub-multiple of the data rate. For example, it is common for a 28 Gb/s SERDES to require a reference clock of 350 Mhz±0.02%, which is associated with an 1/80 of the data rate. During the data sampling process, a SERDES receiver is typically phase locked and a specific position of the clock signal is used.

Figure 1:
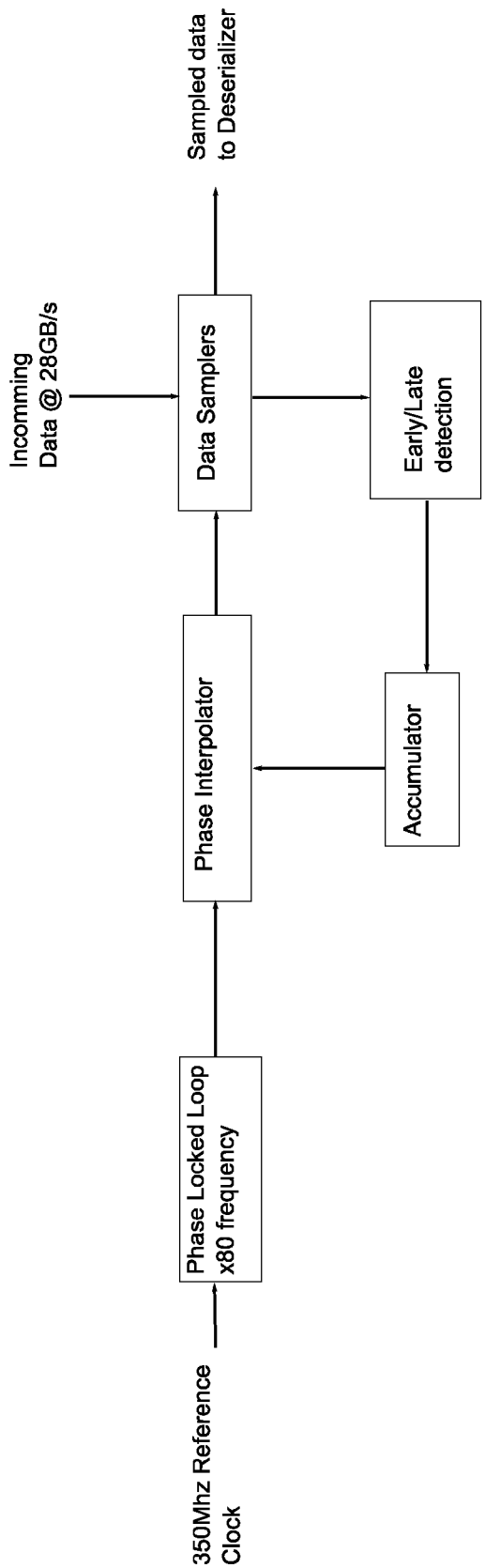
FIG. 1 is a simplified diagram illustrating a conventional SERDES receiver.

FIG. 1 is a simplified diagram illustrating a conventional SERDES receiver. As shown in FIG. 1, a reference clock provides a 350 Mhz reference frequency, which is multiplied by a phase-lock loop (PLL) to produce a clock at the required data rate (or a sub-multiple thereof for a time interleaved system). The clock signal is adjusted, in phase and frequency, by a phase interpolator to produce clock signals aligned to the center and edges of the incoming data. An early/late detection logic determines whether the clocks are sampling in the center of the eye, and adjusts the controls of the phase interpolator to get the required alignment. The external reference clock and the PLL can consume a relatively large amount of power for the SERDES receiver.

Typically, when receiver is phase locked with incoming data, the data is sampled to mid-eye position for the best signal-to-noise ratio. To ensure the performance of the communication link, most low-power high-speed SERDES transceivers utilize skew error correction mechanisms on the data and edge sampler clocks. For example, a low-power clock and data recovery (CDR) mechanism, as often a part of SERDES implementations, uses the edge sample clock and data sample clock for clock and data extractions. Skew errors, where clock signals arrive at different components at different times, are typically present between data and edge clocks, which cause the CDR to sample the data at non-optimum points, thereby reducing the performance of the SERDES receiver (e.g., reduced jitter tolerance). In conventional systems, skew errors can be reduced by using large devices to drive the clocks, but these large devices also carry a heavy power penalty. For low-power, high-speed, and high-performance applications, new techniques for skew correction is desired.

In designing and implementing high-performance high-speed CDRs, an important aspect is to keep the device size small and power consumption low, while keeping the skew error between clocks constant when operating at different processes, temperatures, voltages. For example, a common approach involves adding power for clock to match skew and to work without skew correction, and the skew between clocks changes with process. There are various types of conventional analogue skew correction methods as well. Unfortunately, conventional skew correction mechanisms typically are often inefficient and consume a large amount of power.

It is thus to be appreciated that embodiments of the present invention provide a method for detecting and removing skew errors, which are typically between the data sample clocks and edge samples clock. More specifically, data samples are processed by an early/late detection module, and a control logic uses the early/late determination information to detect the skew error. For example, the skew error detection process is performed when the communication system powers up, or when the parameters of data transmission change (e.g., changing date rat). Skew errors can be corrected by changing the delay between data and edge sample clock (e.g., via analog delay, or by using phase interpolator). Embodiments of the present invention can be implemented in half rate architecture as well as other types earl/late CDR architectures (e.g., quarter rate architecture).

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 2:
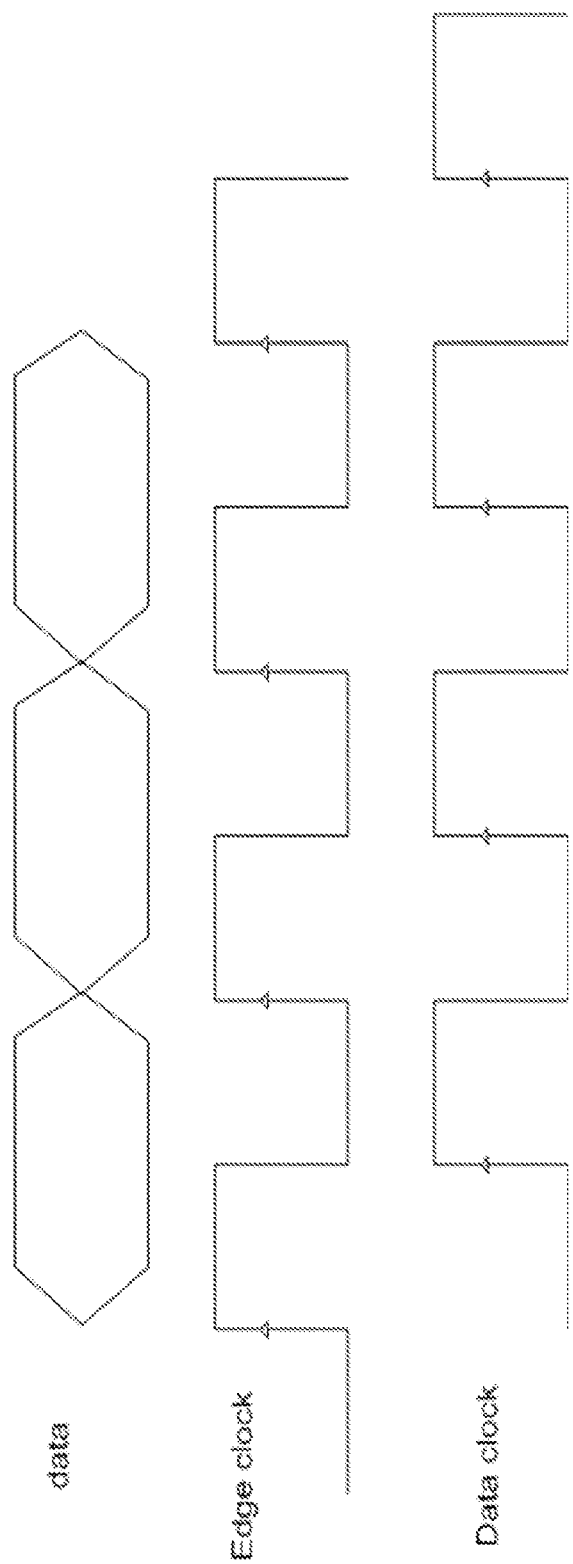
FIG. 2 is a simplified diagram illustrating relationship among data, edge clock, and data clock.

In various embodiments, a bang-bang algorithm uses early/late information to align the edge clock and data clock. FIG. 2 is a simplified diagram illustrating relationship among data, edge clock, and data clock. This diagram is merely an example, which should not unduly limit the scope of the claims. One of ordinary skill in the art would recognize many variations, alternatives, and modifications. As shown in FIG. 2, data line is characterized by a data rate and can be sampled when the data line is "on" during each of the time period. The edge clock and the data clock operate at the same frequency as the data line. More specifically, the edge clock is on during the first half of the data line period, and it is off during the second half of data line period. The data clock as shown is the inverse of the edge clock, and it is on during the second half of the data line period. For optimal data sampling, it is desirable that there is no skew, and the data clock samples the data at mid-point (e.g., where data is most stable) for best signal-to-noise ratio. However, if there is skew error between edge clock and data clock, then data clock samples the data at a non-optimal point. Thus an important aspect of data sampling is to remove skew error and sample the data line at the optimal sample region (e.g., center of the data line period).

According to various embodiments, the present invention provides a skew correction mechanism that uses an adjustment delay that minimizes and/or removes skew between clocks. The adjustment delay is determined by performing data sampling at a calibration frequency (or an "off frequency") and using different test delay amounts. For example, adjustment delay refers to a relative delay between the edge clock and the data clock that is determined specifically for the receiver system and used to minimize and/or remove skew errors. When the data sampling is performed at the "off frequency", the sampled data are mostly noise, and the number of "early" data samples should be approximates equal to the number of "late" data samples if the correct amount of delay is used. For example, if the sampling frequency of the clocks signals is deliberately set far from the actual operating frequency (e.g., by far more than the tracking range of the CDR and less than a factor of 2; for a link with an operating frequency 28 Gb/s, performing sampling at a frequency of 23 Gb/s), then the CDR loses its the ability to track the data. In this situation, the data sampled at "off" frequency are essentially noise, and there should be about the same number of "early" and "late" samples, provided that the number of data samples is statistically significant (e.g., at least 500 samples). For example, with the data edges being substantially random to the clocks (e.g., sampling at "off" frequency), the probability of having an edge in between a data clock and an edge clock becomes proportional to the time between the two clocks. By counting the number of data edges between each pair of clocks over a sufficiently large window (e.g., statistically significant number of data samples), the skew can be determine by measuring of the time between each clock. For example, the number of edges detected in the time window edge-clock to data-clock should be equal to the number of edges in the time window data-clock to edge-clock.

It is to be appreciated that embodiments of the present invention can be implemented using existing hardware. For example, conventional CDR mechanisms typically include hardware for detecting and counting the edges between each pair of clocks, and the edge detection and counting operations do not require high-speed circuits. As a result, embodiments of the present invention can be inexpensively implemented with low power consumption. For example, certain embodiments of the present invention can be implemented by using software, where the control module is implemented to execute software algorithms to determine the adjustment delay that is to be used to correct skew errors. Depending on the implementation, the software algorithms may be executed at system start up and/or when skew errors are detected.

Figure 3:
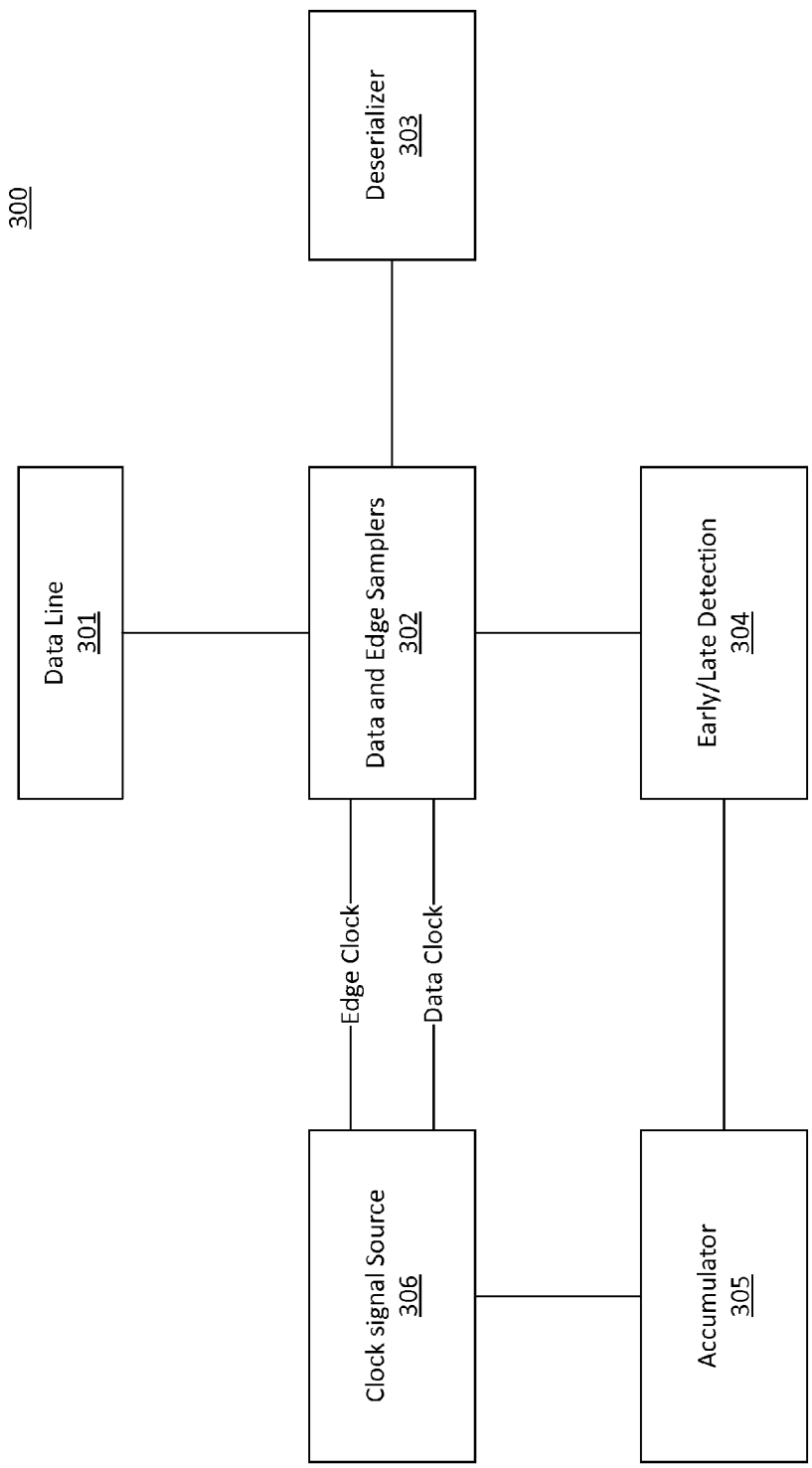
FIG. 3 is a simplified diagram illustrating a SERDES receiver 300 according to an embodiment of the present invention.

FIG. 3 is a simplified diagram illustrating a SERDES receiver 300 according to an embodiment of the present invention. This diagram is merely an example, which should not unduly limit the scope of the claims. One of ordinary skill in the art would recognize many variations, alternatives, and modifications. The SERDES receiver 300 includes a sampler 301, which is configured to sample the incoming data from the data line 201 at a sample rate that is based on the clock frequency of the clock signal source 206. The sampler 301 outputs sampled data to a deserializer 303. It is to be understood that the sampler 302 often uses more than one clocks to perform data sampling. In various embodiments, the data sampler 302 includes an edge clock sampler and a data clock sampler. The data sampler 302 may include additional samplers as needed. As shown in FIG. 3, edge clock signals and data clock signals are received from the clock signal source 306.

In various embodiments, incoming data are received through a data communication interface. For example, the data communication interface may be implemented to receive data received from one or more optical communication links. The incoming data are characterized by a data rate that is typically unchanged once the receiver 300 starts operating.

The sampler 302 is connected to the detection module 304. The detection module 304 determines whether the sample data are early or late. For example, the detection module 304 can be implemented in various ways. For example, the detection module 304 may be implemented using a CDR phase comparator. The detection module 304 may be implemented in other ways as well. In certain embodiments, the detection module 304 output a number for each of the early/late determination made. For example, the early/late determination is based on the relative position between the data clock and the edge clock. If the data clock is late relative to the edge samples, then the output of the detection module is negative; if the data clock is early relative to the edge samples, then the output of the detection module is positive. The output of the detection module 304 is processed by the accumulator 305. For example, the accumulator 305 stores a sum value based on the output provided by the detection module 305. The sum value stored at the accumulator represents an average early/late detection for a large sample size at a given frequency. In certain embodiments, the accumulator 305 is configured to calculate an average position value.

For the purpose of calibrating the receiver 300 and to remove skew errors, signals from the clock signal source 306 are specifically set at an "off" frequency. For example, for data samples from the data link of 28 Gb/s, the clock source 306 provides signals for sampler 302 to perform data and edge sampling at a frequency of 23 Gb/s, which is sufficiently different from 28 Gb/s that the sampler 302 is unable to meaningfully sample actual data. Instead, data samples obtained at 23 Gb/s are mostly noise as a result of asynchronous sampling by both the edge sampler and the data sampler. If the sum and updated by the accumulator 305 is a large positive number, it means that there are many "early" samples determined by the detection module 304, and skew errors can likely to be removed by increasing the amount of delay. On the other hand, if the sum stored and updated by the accumulator 305 is a large negative number, it means that there are many "late" samples determined by the detection module 304, and skew errors can likely to be removed by decreasing the amount of delay. Among other things, the receiver 300 can use the information stored by the accumulator 207 to adjust the delay amount needed to remove skew errors.

Various parameters for the edge clock and the data clock are regulated by the clock signal source 306. For example, the clock signal source 306 may be implemented using a voltage controlled oscillator, which responds to control signals from a control module. The control module (not shown in FIG. 3) is configured to cause the VCO to vary both clock frequencies and delay amounts as needed. In various embodiments, the VCO is implemented on the same chip as other components of the receiver 300. For example, the receiver 300 integrates components such as communication interface, sampler, detection module, accumulator, VCO, and/or other components on a single chip, which translates to reduced power consumption and chip size when compared to conventional devices. According to a specific embodiment, the VCO is connected to the digital control module and the analog control module. The digital control module provides digital control for adjusting the frequency of the VCO. The analog control module is configured to provide an input that advances or retards the phase of clock signals generated by the VCO. For example, the digital control module and analog control module are implemented as parts of a feedback control loop that adjusts the outputs of the VCO based on the output of the accumulator 305. The clock signal source 306 keeps changing the relative delay between the data clock and the edge clock until the average position is about "0", or the sum stored by the accumulator 305 is about "0". When average position is about "0" (or the accumulator sum is about "0"), the relatively delay associated with the "0" average position is the adjustment delay that is to be used by the receiver to remove skew errors. It is to be appreciated that the adjustment delay determined according this process is effective in minimizing and/or removing skew errors, thereby improving system performance. Among other performance metrics, jitter tolerance of the receiver is improved when the adjustment delay is used.

According to certain embodiments, the clock signal source 306 is implemented using an external reference clock that provides a reference signal, a phase lock loop (PLL) that multiplies the reference signal frequency, and a phase interpolator (e.g., similar to the system illustrated in FIG. 1) that provides phase adjustment. Edge clock and data clock are provided by the phase interpolator. Various parameters (frequency, phase, delay, etc.) of the edge clock and the data clock are controlled by one or more control modules. For example, a control module provides control signals to the PLL and/or phase interpolator, and together the external reference clock, the PLL, the phase interpolator, and the control module constitute the clock signal source 306 as shown in FIG. 3. The initial frequency (the calibration frequency) used for determining adjustment delay is specifically selected to be different from the data rate frequency, at which the PLL is not locked. When the PLL is not locked, the incoming data from the data line 301 are asynchronously sampled by the edge clock and the data clock. By changing the delay (e.g., at the phase interpolator), the data clock and/or edge clock can be delayed relative to each other, and as a result the accumulation of early/late determination stored by the accumulator can be adjusted.

It is to be appreciated that by changing parameters of the data clock and edge clock signals using existing hardware, adjustment delay for minimizing and/or removing skew errors can be determined. For example, the adjustment delay may be associated with physical characteristics of the data transmission link, sampling algorithm, and/or other characteristics. Once the adjustment delay for the receiver 300 is determined, the adjustment delay can be used in data transmission and processing.

Figure 4:
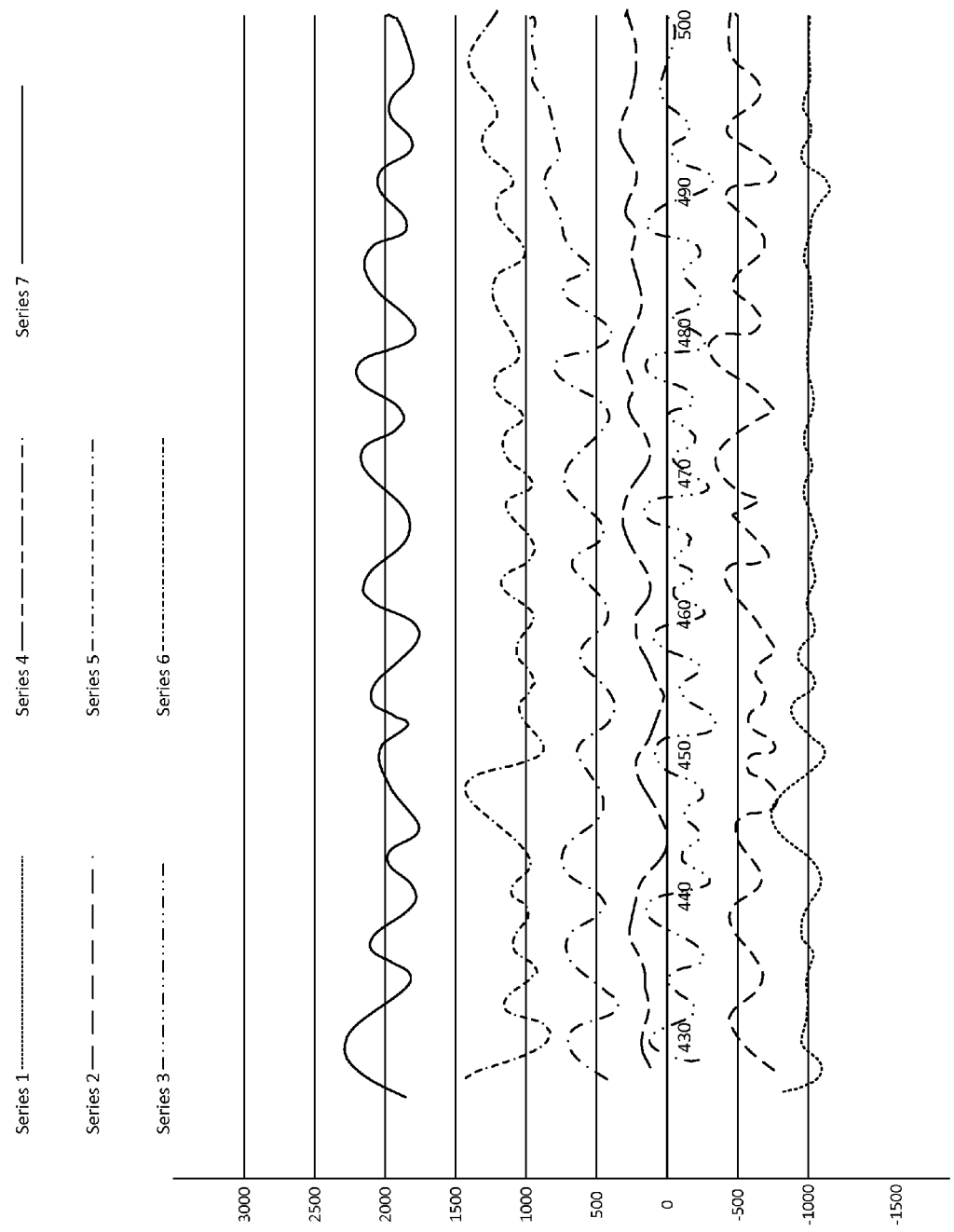
FIG. 4 is a simplified diagram illustrating a process for determining adjustment delay according to an embodiment of the present invention.

FIG. 4 is a simplified diagram illustrating a process for determining adjustment delay according to an embodiment of the present invention. This diagram is merely an example, which should not unduly limit the scope of the claims. One of ordinary skill in the art would recognize many variations, alternatives, and modifications. The vertical axis represents the amount of early and late detections. For example, each unit on the vertical axis represents an early or late detection. For example, "1000" indicates an average position between the data clock and the edge clock is about 1000. For example, an average of "1000" may come from 1500 early detections and 500 late detections, and it means that that the relative delay is early. On the other hand, an average of "−1000" may come from 500 early detections and 1500 late detections. The horizontal axis represents the frequency codes that correspond to sampling frequency. For example, each code corresponds to 50 MHz, which means "500" on the axis translates to 25 GHz. To determine the correct adjustment delay to be used to remove skew errors, different relative delay is used to sample data at different frequencies. For example, the "Series 1" correspond to an average "−1000", "Series 2" correspond to an average of "−700". For both Series 1 and Series 2, the data clock is relatively late in relation to the edge clock, and Series 1 is later than Series 2. By moving the relative delay more in the direction of Series 2, the average position is minimized to close "0" with Series 4. By moving further in the same direction, the data clock becomes earlier and earlier relative to the edge clock (e.g., moving from Series 4 to Series 5, and from Series 5 to Series 6, and so on). In various embodiments, the present invention provides an algorithm for changing the relative delay between the data clock and the edge clock until the average position is close to "0". For example, if the average position is a positive number, the algorithm moves the relative delay in a direction to make the data clock relative late in relation to the edge clock; on the other, if the average position is a negative number, the algorithm moves the relative delay in a direction to make the data clock relative early in relation to the edge clock. Once the average position is "0" or close to "0", the relative delay associated with this "0" average position is determined to be the adjustment delay that is later to be used to minimize and remove skew errors.

Depending on the implementation, the adjustment delay parameter that is later to be used for actual sampling can be determined using various processes. In a specific implementation, a predetermined number of test delays are tried at a calibration frequency, which is different from the actual sampling frequency. For each of the test delays, a statistically large number of samplings are performed at the calibration frequency. For example, at least 500 samplings are performed, and the number of samplings can be as high as over 3000. For each of the samplings, both edge sample and data sample are obtained, and the early/late detection logic determines a relative position between the edge sample and the data sample. The accumulator then calculates an average position using the relative position values. For example, n samplings are performed for each test delay, and for each of the n samplings, a relative position value is determined. The average position is the average of the n relative position values. The objective is to select the test delay that has the lowest average position (or closest to zero). For example, in FIG. 4, each of the "Series" correspond to a test delay. Series 4 in FIG. 4 is closest to zero, and the test delay that corresponds to Series 4 is selected as the adjustment delay parameter that is to be used during the actual sampling processes. Depending on the implementation, more than more calibration frequencies may be used. For example, as shown in FIG. 4, each of the series have test average position values at different frequencies.

Figure 5:
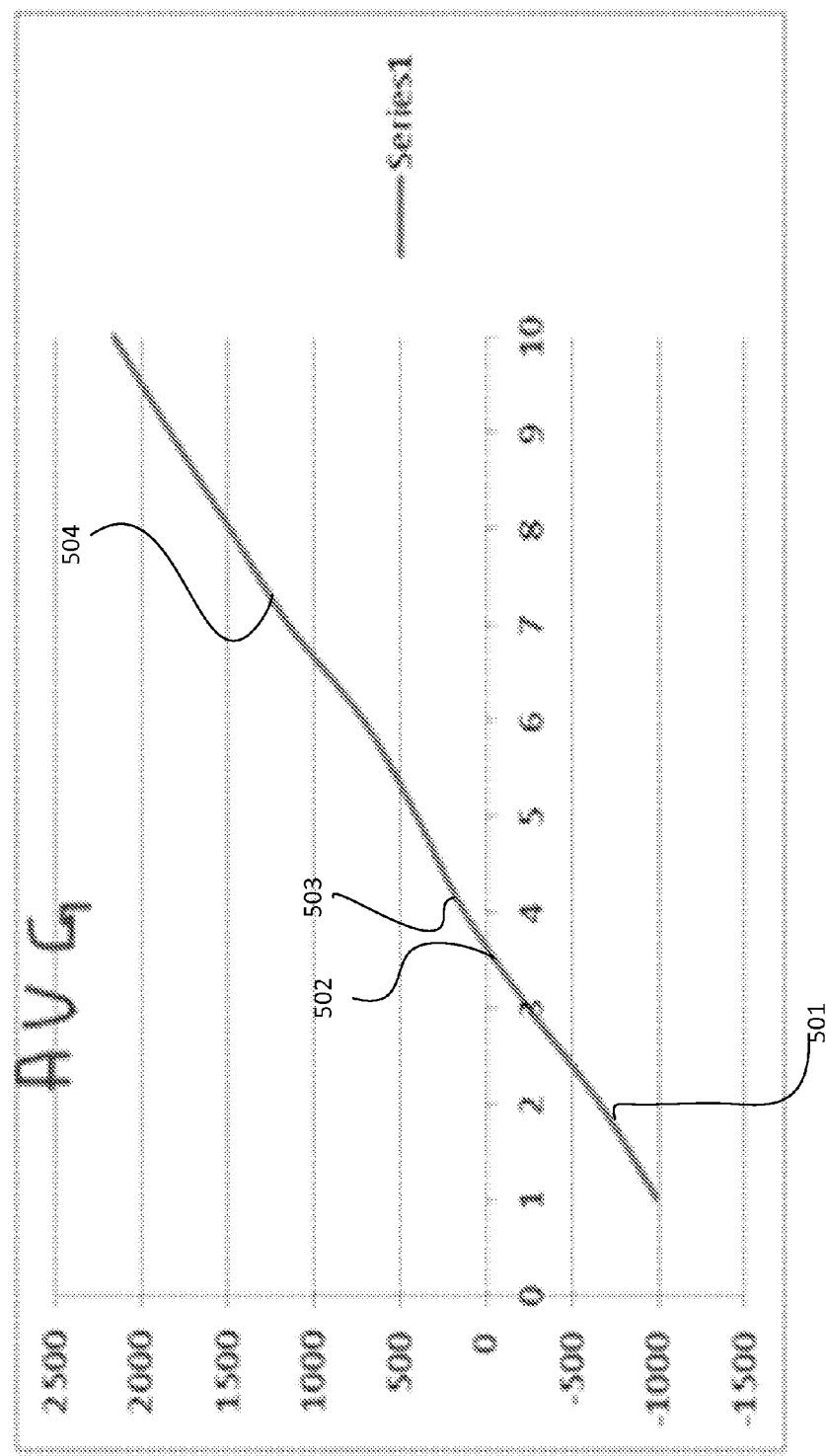
FIG. 5 is a simplified diagram illustrating a process for determining adjustment delay according to an embodiment of the present invention.

FIG. 5 is a simplified diagram illustrating a process for determining adjustment delay according to an embodiment of the present invention. This diagram is merely an example, which should not unduly limit the scope of the claims. One of ordinary skill in the art would recognize many variations, alternatives, and modifications. The vertical axis in FIG. 5 represents the amount of early and late detections. For example, each unit on the vertical axis represents an early or late detection. For example, "1000" indicates an average position between the data clock and the edge clock is about 1000. For example, an average of "1000" may come from 1500 early detections and 500 late detections, and it means that that the relative delay is early. On the other hand, an average of "−1000" may come from 500 early detections and 1500 late detections. The horizontal axis represents the relative delay between the data clock and the sample clock. For example, each unit on the horizontal axis represents a relative delay amount. Since the goal, as explained above, is to minimize the average position, the amount of relative delay to be used in this particular graph is about midpoint between "3" and "4", where corresponding average position is "0".

As explained above, the adjustment delay parameter that is later to be used for actual sampling can be determined using different processes or algorithms. In addition to trying different test delay parameters, iterative methods may be used to determine the adjustment delay parameter. For example, a first test delay is selected. Samplings, relative position calculations, and average position is determined for the first test delay. To illustrate, the first test delay correspond to point 501 on FIG. 5. Next, a second test delay is selected. Sampling, relative position calculations, and average position is determined for the second test delay, which corresponds to point 503 on FIG. 5. Assuming a linear relationship between delay and the average position, the adjustment delay parameter is determined by interpolating point 501 and point 503, and the adjustment delay parameter is selected to correspond to point 502.

In another implementation, an initial test delay parameter is selected, which correspond to point 501. Since the average position value for point 501 is negative, a second test delay parameter is selected to move the average position value to positive, to point 504. However, while the second test delay parameter moves in the right direction, it overshoots, as point 504 corresponds to large positive value. A third test delay parameter is then used to move the average position value back a little, to point 503. The average position value at point 503 is fairly close to zero. Depending on the implementation, the average position value at point 503 may be close enough (e.g., within a predefined threshold value), and the delay parameter corresponding to point 503 is selected as the adjustment delay parameter.

It is to be appreciated embodiments of the present invention provide example of determining adjustment delay parameter for data sampling. There can be other methods and processes as well.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A SerDes device comprising:
 a receiver device comprising:
  a data communication interface for receiving incoming data, the incoming data being associated with a sampling frequency;
  a clock signal source configured to provide an edge clock and a data clock;
  a sampler comprising an edge sampler and a data sampler, the edge sampler being configured to sample first data using the edge clock, and the data sampler being configured to sample second data using the data clock;
  a detection logic configured to determine relative delays between the first data and the second data; and
  an accumulator for generating an average position based on the relative delays;
 wherein the receiver is configured to:
  initiate a delay calibration process;
  select a calibration frequency, the calibration frequency being different from the sampling frequency;
  perform n sampling processes at the calibration frequency on the incoming data using m test delays to generate n first data and n second data for each of the m test delays;
  determine relative delays for each of the n first data and corresponding second data for each of the m test delays by the detection logic;
  calculate m average positions corresponding to m test delays using the accumulator;
  select a target delay from the m test delays based on a lowest average position value; and
  sample the first data and the second data using with at least the target delay; and
 an input for providing the incoming data.

2. The device of claim 1 wherein the calibration frequency is different from the sampling frequency by at least 10%.

3. The device of claim 1 the data sampler samples substantially noise at the calibration frequency.

4. The device of claim 1 wherein the sampler is coupled to a deserializer module.

5. The device of claim 1 wherein the clock signal source comprises a voltage control oscillator.

6. The device of claim 1 wherein the clock signal source comprises a phase-lock loop and a phase interpolator, the phase-lock loop being not locked at the calibration frequency.

7. The device of claim 1 wherein the relative delays are associated with skew errors.

8. The device of claim 1 wherein each of the relative delay is based on the relative position between a data sample and an edge sample.

9. The device of claim 1 wherein n is greater than 500.

10. A SerDes device comprising:
a receiver device comprising:
a data communication interface for receiving incoming data, the incoming data being associated with a sampling frequency;
a clock signal source configured to provide an edge clock and a data clock;
a sampler comprising an edge sampler and a data sampler, the edge sampler being configured to sample first data using the edge clock, and the data sampler being configured to sample second data using the data clock;
a detection logic configured to determine relative delays between the first data and the second data; and
an accumulator for generating an average position based on the relative delays;
wherein the receiver is configured to:
initiate a delay calibration process;
select a calibration frequency, the calibration frequency being different from the sampling frequency;
perform n samplings using a first test delay at the calibration frequency to generate n first data and n second data for the first test delay;
determine relative delays for each of the n first data and corresponding second data for the first test delay by the detection logic;
calculate a first average position for the first test delays using the accumulator; and
provide a second test delay based at least on the first test delay and the first average position, the second test delay being associated with a second average position, the second average position being closer to zero than the first average position.

11. The device of claim 10 wherein the receiver is further configured to:
provide n test delays based on first test delay and the second test delay, each of the successive n test being associated with an average position closer to zero than previous average position.

12. The device of claim 10 the receiver is further configured to:
providing a threshold average position value;
providing a third test delay;
perform n samplings using the third test delay at the calibration frequency to generate n first data and n second data for the third test delay;
calculating a third average position using the n first data and n second data associated with the third test delay;
comparing the third average position to the threshold average position value;
selecting the third test delay as an adjustment delay parameter if the third average position is equal to or less than the threshold average position value.

13. The device of claim 10 wherein the sampling frequency is greater than 1 GHz.

14. The device of claim 10 wherein n is at least 1000.

15. The device of claim 10 wherein:
a relative delay is positive if the first data is earlier relative to the second data;
a relatively delay is negative is the first data is later relative to the second data.

16. A method for processing data, the method comprising a skew correction for a SerDes device, the method comprising:
receiving incoming data from a data line, the incoming data being characterized by a sampling frequency;
providing an edge clock and a data clock;
selecting a first calibration frequency, the first calibration frequency being different from the sampling frequency;
performing n samplings using a first test delay at the first calibration frequency to generate n first data using the data clock and n second data using the data clock for the first test delay;
determining relatively delays for each of n first data and corresponding second data for the first test delay by a detection logic;
calculating a first average position for the first test delay;
providing a second test delay;
calculating a second average position for the second test delay;
interpolating at least the first average position and a second average position to determine an adjustment delay parameter; and
sampling incoming data at the sampling frequency using the adjustment delay parameter.

17. The method of claim 16 further comprising:
providing a plurality of test delays;
calculating average positions for the plurality of test delays;
interpolating the plurality of test delays to determine the adjustment delay parameter.

18. The method of claim 16 further comprising performing n samplings using the second delay at the first calibration frequency.

19. The method of claim 16 further comprising performing n samplings using the first delay at a second calibration frequency, the second calibration frequency being different from the sampling frequency and the first calibration frequency.

20. The method of claim 16 further comprising:
storing average position values using an accumulator;
comprising the average positions to select a lowest average position value;
selecting the adjustment delay parameter associated with lowest average position value.

* * * * *